United States Patent
Rajendran et al.

(10) Patent No.: US 8,391,819 B2
(45) Date of Patent: Mar. 5, 2013

(54) NARROW BAND RF FILTER CIRCUITS, DEVICES AND PROCESSES USING IMPEDANCE TRANSLATION

(75) Inventors: Gireesh Rajendran, Bangalore (IN); Ashish Lachhwani, Bangalore (IN); Rakesh Kumar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 370 days.

(21) Appl. No.: 12/757,739

(22) Filed: Apr. 9, 2010

(65) Prior Publication Data

US 2011/0207420 A1    Aug. 25, 2011

(30) Foreign Application Priority Data

Feb. 23, 2010    (IN) .............. 468/CHE/2010

(51) Int. Cl.
*H04B 1/40*    (2006.01)
*H03H 7/01*    (2006.01)

(52) U.S. Cl. ............ 455/307; 455/114.2; 455/339; 333/174; 333/176

(58) Field of Classification Search ........... 455/296, 455/307, 323, 326, 339, 340, 114.2; 333/167–176
See application file for complete search history.

(56) References Cited

U.S. PATENT DOCUMENTS

| | | | |
|---|---|---|---|
| 6,597,900 | B1 | 7/2003 | Marshall et al. |
| 8,005,448 | B1* | 8/2011 | Yan et al. .............. 455/226.1 |
| 2004/0053593 | A1* | 3/2004 | Siddall .................. 455/307 |
| 2007/0066256 | A1* | 3/2007 | Lee ....................... 455/188.1 |
| 2007/0173209 | A1 | 7/2007 | Kim et al. |
| 2009/0086658 | A1 | 4/2009 | Teillet et al. |
| 2009/0289721 | A1 | 11/2009 | Rajendran et al. |
| 2010/0027568 | A1 | 2/2010 | Rajendran et al. |

OTHER PUBLICATIONS

Darabi, H. A Blocker Filtering Technique for Wireless Receivers. Int'l Solid-State Circuits Conference (ISSCC) 2007. pp. 84-85, 588, Figs. 4.4.1-4.4.4.

Marholev, B. et al., A Single-Chip Bluetooth EDR Device in 0.13um CMOS, Int'l Solid-State Circuits Conference (ISSCC) 2007. pp. 558-559, 621. Figs. 31.1.1-31.1.2.

Knopik, V. et al., 0.18 um thin oxide CMOS transceiver front-end with integrated Tx/Rx/ commutator for low cost Bluetooth solutions. Proc. 29th European Solid-State Circuits Conference (ESSCIRC), 2003. pp. 675-678, Figs. 1-3, 7.

* cited by examiner

*Primary Examiner* — Blane J Jackson
(74) *Attorney, Agent, or Firm* — Wade J. Brady, III; Frederick J. Telecky, Jr.

(57) ABSTRACT

An active filter circuit includes an inductance-capacitance (LC) circuit (110) for wireless frequency input, a bi-directional mixer (120) and a filter impedance (130) series-coupled across at least part of the LC circuit (110), and another mixer (420) coupled to at least some portion of the LC circuit. Other circuits, processes, receivers, transmitters and transceivers are disclosed.

25 Claims, 6 Drawing Sheets

NARROW BAND RF FILTER CIRCUITS, DEVICES AND PROCESSES USING IMPEDANCE TRANSLATION

CROSS-REFERENCES TO RELATED APPLICATIONS

This application is related to India Patent Application 468/CHE/2010 "Narrow Band RF Filter Circuits, Devices and Processes Using Impedance Translation," filed Feb. 23, 2010, for which priority is claimed under the Paris Convention and 35 U.S.C. 119 and all other applicable law, and which is incorporated herein by reference in its entirety.

This application incorporates herein the following U.S. patent application Publication by reference in its entirety: 20090289721, Rajendran et al., Nov. 26, 2009 (TI-66109) filed May 5, 2009, titled "Circuits, Processes, Devices and Systems for Full Integration of RF Front End Module Including RF Power Amplifier."

This application incorporates herein the following U.S. patent application Publication by reference in its entirety: 20100027568 Rajendran et al., Feb. 4, 2010 (TI-65587) filed Jul. 29, 2008, titled "Technique for Sharing Transmit and Receive Ports of a CMOS Based Transceiver."

STATEMENT REGARDING FEDERALLY SPONSORED RESEARCH OR DEVELOPMENT

Not applicable

COPYRIGHT NOTIFICATION

Portions of this patent application contain materials that are subject to copyright protection. The copyright owner has no objection to the facsimile reproduction by anyone of the patent document, or the patent disclosure, as it appears in the United States Patent and Trademark Office, but otherwise reserves all copyright rights whatsoever.

BACKGROUND

This invention is in the field of active filters in electronic circuits. Wireless communications and electronics can benefit by improved circuits, devices, and systems for wireless communication, and processes of operating and making them.

In narrowband filter design, a tuned LC filter is used to provide selectivity on receive and provide filtering for transmit signal paths. An approximate frequency called a 3 dB point at which impedance falls 3 dB from a peak impedance value of the LC filter is given by a bandwidth Fo (1−1/(2Q)) where Q is the quality factor.

For an integrated LC filter at 2.4 Ghz with a Q=8, 3 dB filtering will happen near 2.25 GHz. For close-in interferers (10 MHz or less to 50 MHz range), the attenuation provided is quite minimal and problematic. In the receive chain, such minimal attenuation increases the linearity requirements for blocks following low noise amplifier LNA, and imposes tighter LO phase noise requirements to handle close-in interferers (reducing in-band noise due to reciprocal mixing). Furthermore, in the transmit chain, such minimal filter attenuation imposes tighter transmitter TX local oscillator LO and signal close-in emission constraints since the filtering provided by the LC filter is minimal at nearby (<50 MHz) frequency offsets from the transmit carrier.

Another on-chip RF (radio frequency for transmit or receive) filter approach operates an LNA. In parallel, a down conversion to baseband feeds a high pass filter the output of which is converted and subtracted from the output of the LNA. An out of band interference signal called a blocker is supposed to be canceled. In this way an auxiliary path with frequency translation and a summer is supposed to create a narrowband RF filter response. That approach introduces the expense of auxiliary path mixer circuits to handle the interferer, and the additional hardware and extra noise introduced by the auxiliary path may not be insignificant.

Yet another RF filter approach is disclosed in the U.S. Pat. No. 6,597,900. A forward path and feedback path with frequency translation are used to offer a controlled impedance at the input. This is supposed to be used along with RF filters to achieve narrowband tuning. The expense of additional hardware including a mixer with high reverse isolation may be not-insignificant.

Another approach might consider a Q-multiplier to increase the Q by an amplifier with output and input coupled to LC, i.e. positive feedback not reaching oscillation. Unfortunately, to get a 3 dB filtering at a nearby frequency (e.g., 5 MHz away from RF signal frequency of 2.4 GHz), the Q required can be on the order of 250. Starting from a Q on the order of 10 for on-chip LC, it is believed not practical or economical to achieve this reliably.

It would be desirable in the art to somehow find a less expensive, less constraining, and less noisy way of doing RF filtering reliably, especially for integrated circuit RF filtering.

It would be desirable to address the above mentioned problems and issues, among others.

Mobile telephony can communicate video and digital data, and voice over packet (VoP or VoIP), in addition to cellular voice. Streams of information such as video, voice, audio content, images of all kinds, and data should be flexibly handled by such mobile devices and platforms. Wireless local area network (WLAN) systems transmit and receive some wireless signals. Short range types of wireless called Bluetooth and Zigbee also exist. Solving problems in integrated circuit RF filtering can benefit numerous forms of wireless and other electronic products and applications.

SUMMARY OF THE INVENTION

Generally, a form of the invention involves an active filter circuit including an inductance-capacitance (LC) circuit for wireless frequency input, a bi-directional mixer and a filter impedance series-coupled across at least part of the LC circuit, and another mixer coupled to at least some portion of the LC circuit.

Generally, another form of the invention involves a wireless receiver front end including a low noise amplifier (LNA) having an output, an RF filter circuit fed from the output of said LNA, a bi-directional mixer and a filter impedance coupled to at least part of said RF filter circuit, and a second mixer coupled to at least some portion of said RF filter circuit.

Generally, a further form of the invention involves a wireless transmitter including an RF power amplifier (PA) having an input, an RF filter circuit coupled to the input of said PA, a bi-directional mixer and a baseband filter impedance coupled to at least part of said RF filter circuit, and an up-converting mixer coupled to feed at least some portion of said RF filter circuit.

Generally, a process form of the invention for operating an electronic circuit, includes RF filtering and impedance-translating a baseband filter impedance into the RF filtering by bi-directional mixing while further coupling the RF filtering with separate mixing for a communication-related signal.

BRIEF DESCRIPTION OF THE VIEWS OF DRAWINGS

Figure 9:
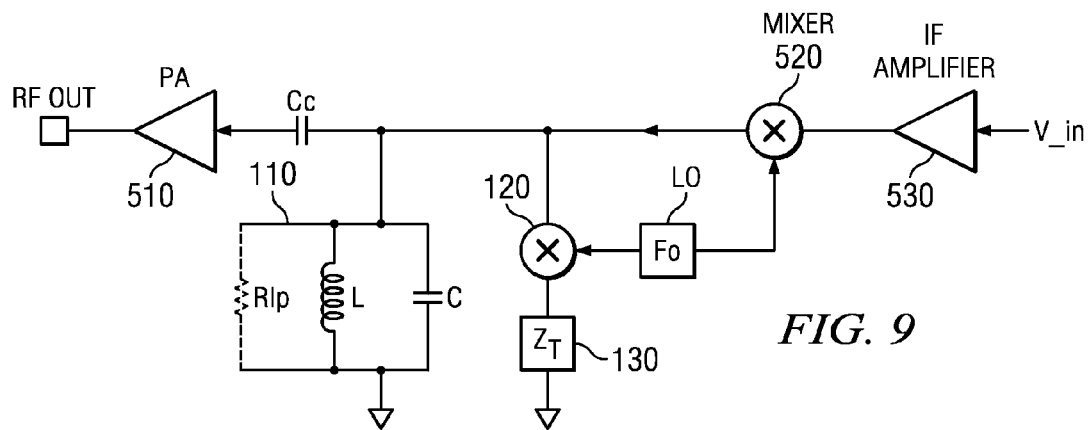
Figure 10:
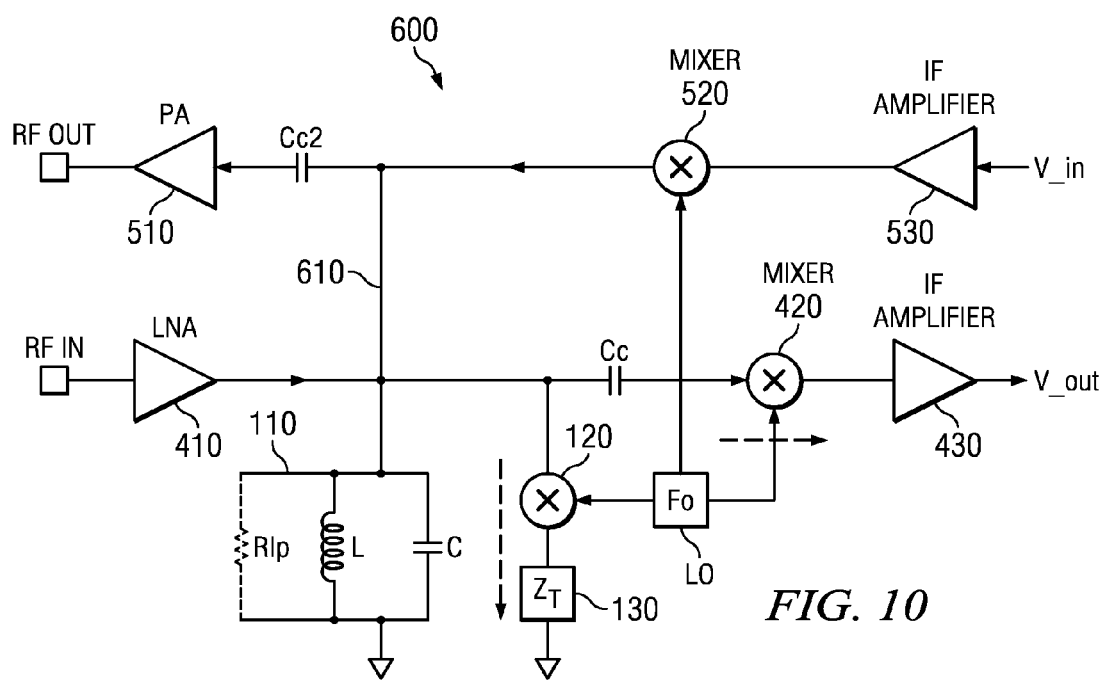

FIG. 9 a partially schematic, partially block diagram of an inventive RF transmitter circuit; and FIG. 10 a partially schematic, partially block diagram of an inventive RF transceiver circuit.

Figure 11:
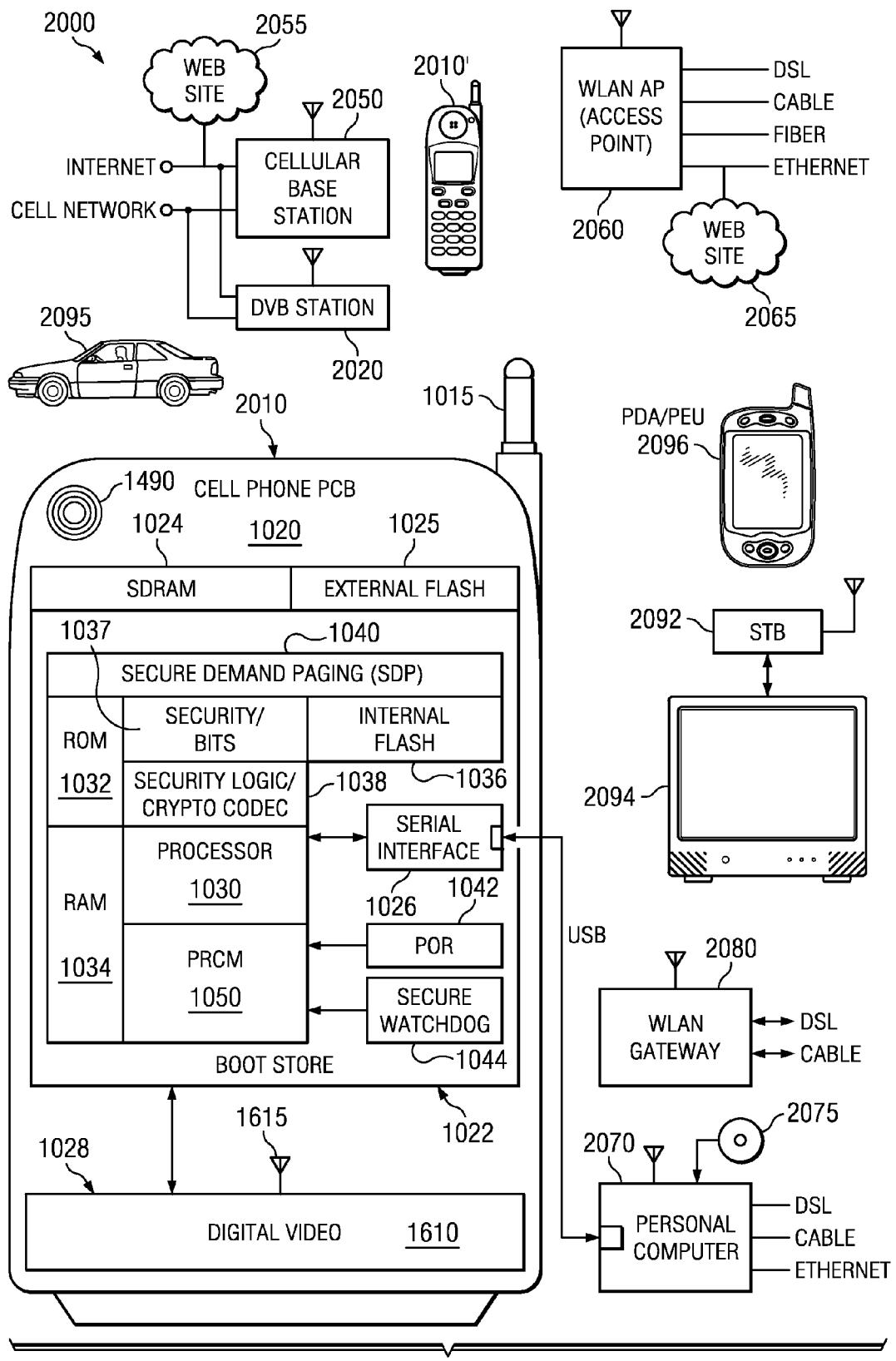

FIG. 11 is a pictorial diagram of a communications system embodiment including system blocks, for example a cellular base station, a DVB video station, a WLAN AP (wireless local area network access point), a WLAN gateway, a personal computer, a set top box and television unit, and two cellular telephone handsets, any one, some or all of the foregoing inventively improved as in the other Figures.

Figure 12:
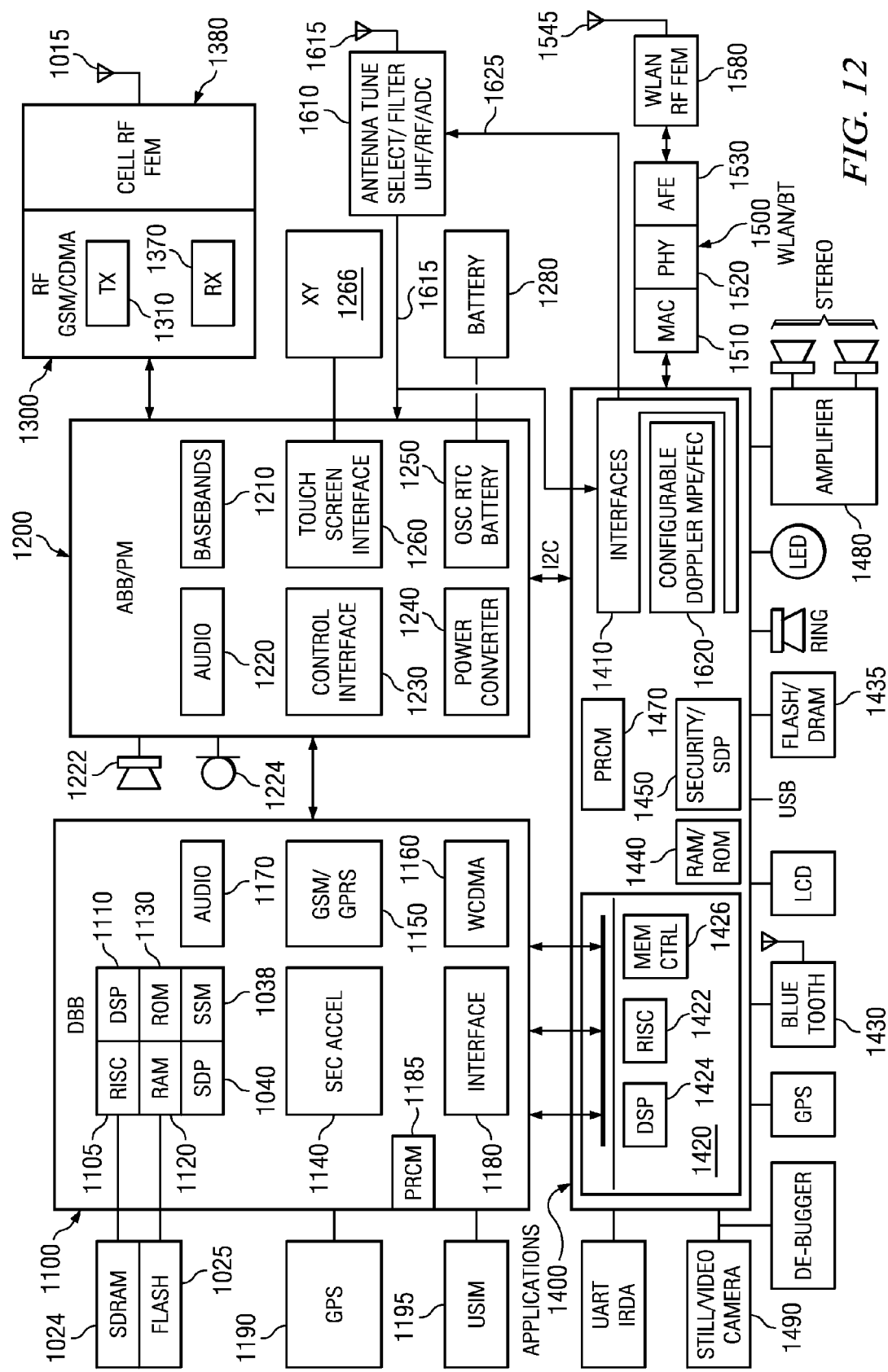

FIG. 12 is a block diagram of inventive integrated circuits for use in the blocks of the communications system of FIG. 11 including the inventive circuits and methods of operation of any of the other Figures.

Corresponding numerals or letter symbols in different Figures indicate corresponding parts except where the context indicates otherwise.

DETAILED DESCRIPTION

Figure 1:
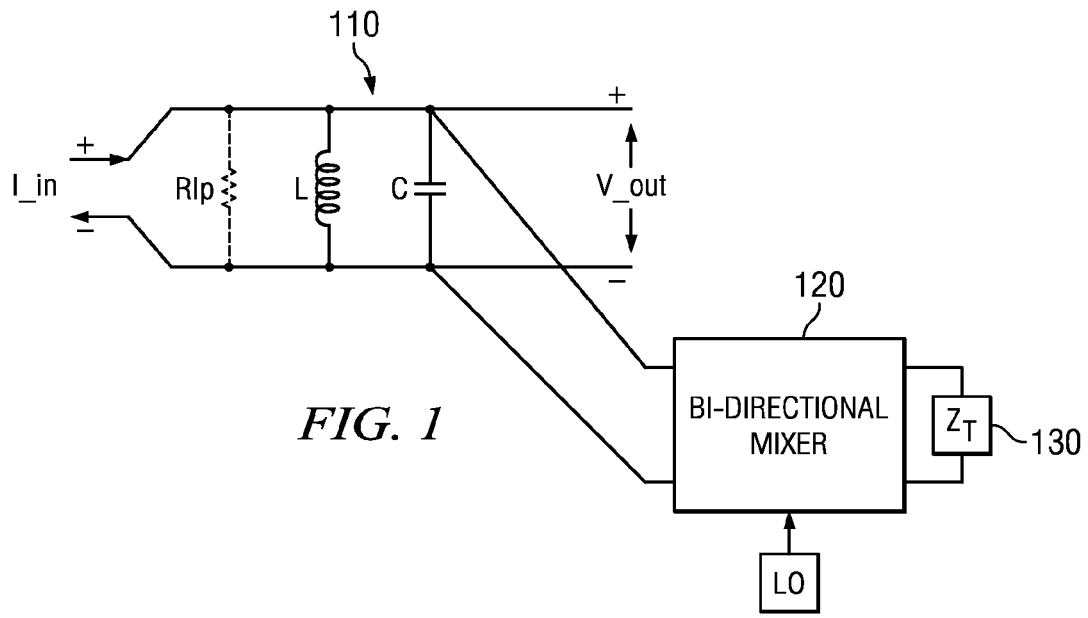
FIG. 1 is a partially schematic, partially block diagram of an inventive RF filter circuit.

In FIG. 1, an LC filter circuit 110 at RF signal frequency is augmented with a single bi-directional mixer 120 coupled across the output of the LC filter circuit for conversion to baseband and back. The bi-directional mixer 120 is terminated in a baseband filter impedance $Z_T$ (130). High reverse isolation is neither necessary nor particularly desirable in this embodiment. The bi-directionality reflects the filter impedance $Z_T$ 130 from baseband to the RF signal frequency band with low noise, low cost and little constraint on mixer 120 isolation.

Figure 2:
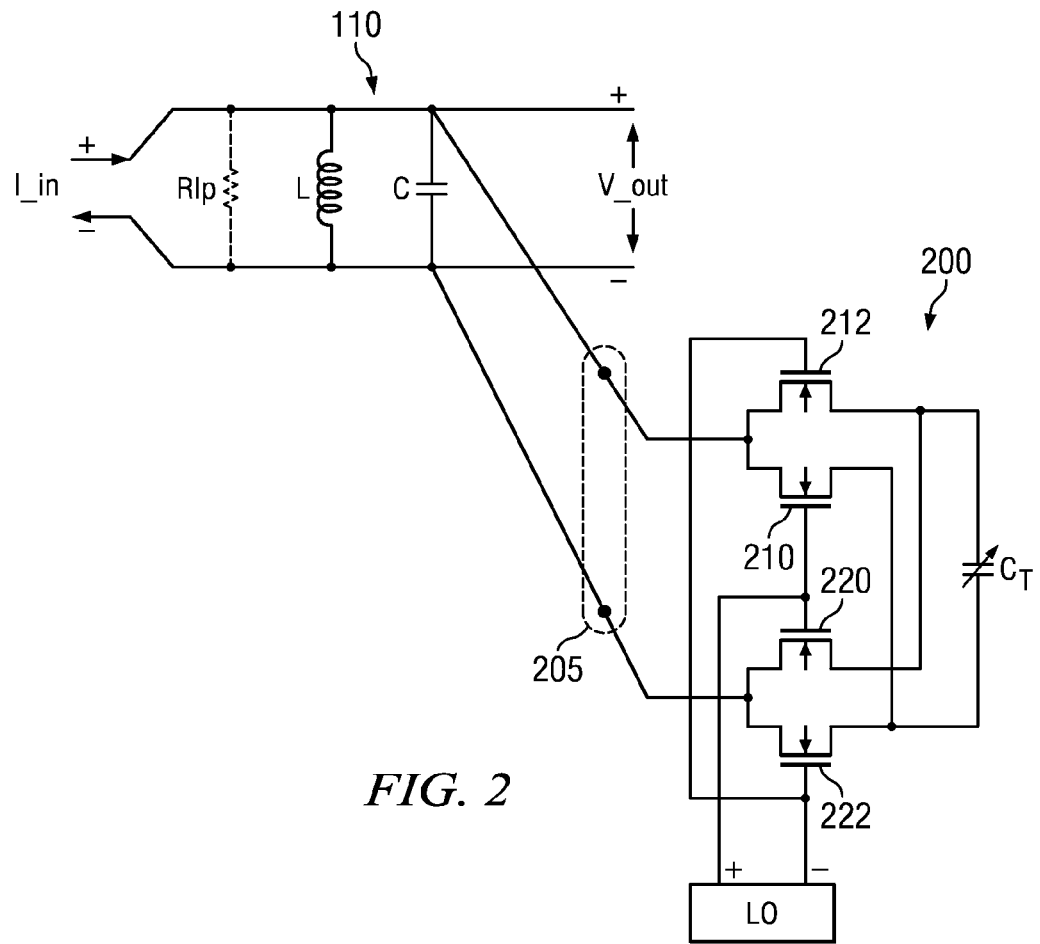
FIG. 2 is a schematic diagram of a more specific example of an inventive circuit for RF filtering of FIG. 1.
Figure 8:
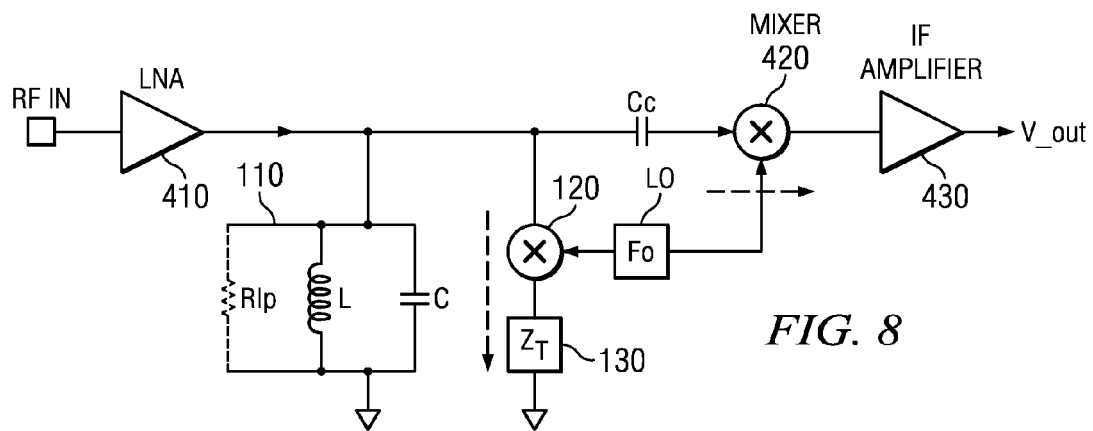
FIG. 8 is a partially schematic, partially block diagram of an inventive RF receiver circuit.

In the embodiments of FIGS. 1 and 2, a tuned LC filter 110 is used to improve the selectivity of receive operations and also provide filtering for transmit signal paths. In FIG. 2, a one-port network is implemented by using a bi-directional mixer 200 and an appropriate termination is connected to the tuned LC filter 110. In this way an active filter circuit is provided having a parallel inductor L and capacitance C for wireless frequency input, a bi-directional mixer 120 (200) and a baseband filter impedance $Z_T$ series-coupled across L and C. In FIGS. 8-10 another mixer and other circuitry are coupled across L and C for various wireless functions.

For a down conversion case, the impedance offered by the termination $Z_T$ at an intermediate frequency F_if is translated to a frequency F_in +/− F_if at the one-port circuit input 205. (Intermediate frequency F_if equals an input Frequency F_in minus a local oscillator LO frequency F_LO.) In this way, the number of devices and components involved are beneficially much-reduced compared to prior schemes with active components. Introduction of complicated auxiliary paths is avoided. Any one, some or all of MOSFET, varactor, MEMS switches, diode circuits, bridges of the foregoing, and other technology, can be used separately or together as manufacturing process and circuit technology to implement the bi-directional mixer 200 with low reverse isolation herein.

In the embodiment of FIG. 2, the termination impedance $Z_T$ 130 of FIG. 1 is shown as an adjustable capacitance $C_T$ and acts as one form of baseband filter impedance. The bidirectional mixer 200 has a balanced topology with two pairs of same-type (all p-type or all n-type instead) field effect transistors FETs 210, 220; and 212, 222. The first pair of FETs 210 and 220 have same type and their sources are respectively coupled via port 205 across opposite ends of the LC filter 110, and their drains are coupled across opposite ends of the adjustable capacitance $C_T$. The second pair of FETs 212 and 222 also have their sources respectively coupled across opposite ends of the LC filter 110 in the same way as FETs 210, 220, but the drains of FETs 212 and 222 are coupled in opposite sense across ends of the adjustable capacitance $C_T$ compared to the drains of FETs 210 and 220. Put another way, the drains of FETs 212 and 220 are both connected to a first end of the adjustable capacitance $C_T$, and the drains of FETs 210 and 222 are both coupled to a second, opposite end of the adjustable capacitance $C_T$.

The local oscillator LO has a plus (+) output coupled to the gates of the FETs 210 and 220. Local oscillator LO has a minus (−) output coupled to the gates of the FETs 212 and 222. The LO produces an alternating positive and negative voltage over time at its plus (+) output to the gates of FETs 210 and 220. The LO concurrently produces an alternating negative and positive voltage over time at its minus (−) output to the gates of the FETs 212 and 222.

In FIG. 2, when and while the LO supplies a positive voltage at some instant at its plus (+) output to the gates of FETS 210 and 220, and also supplies negative voltage at that instant at its minus (−) output to the gates of FETS 212 and 222, then FET pairs 210 and 220 couple opposite conductors of LC circuit 230 to opposite ends of the termination impedance $C_T$ in a first sense. Then when the LO voltage reverses in polarity a half cycle later, then FET pair 210 and 220 turns off and FET pair 212 and 222 turn on (become conductive) and couple the same opposite conductors of LC circuit 230 to opposite ends of the termination impedance $Z_T$ in a second sense of connection opposite to the first sense.

In this way, less expensive, less constraining, and less noisy embodiments for RF filtering are provided, especially for integrated circuit RF filtering.

Figure 3:
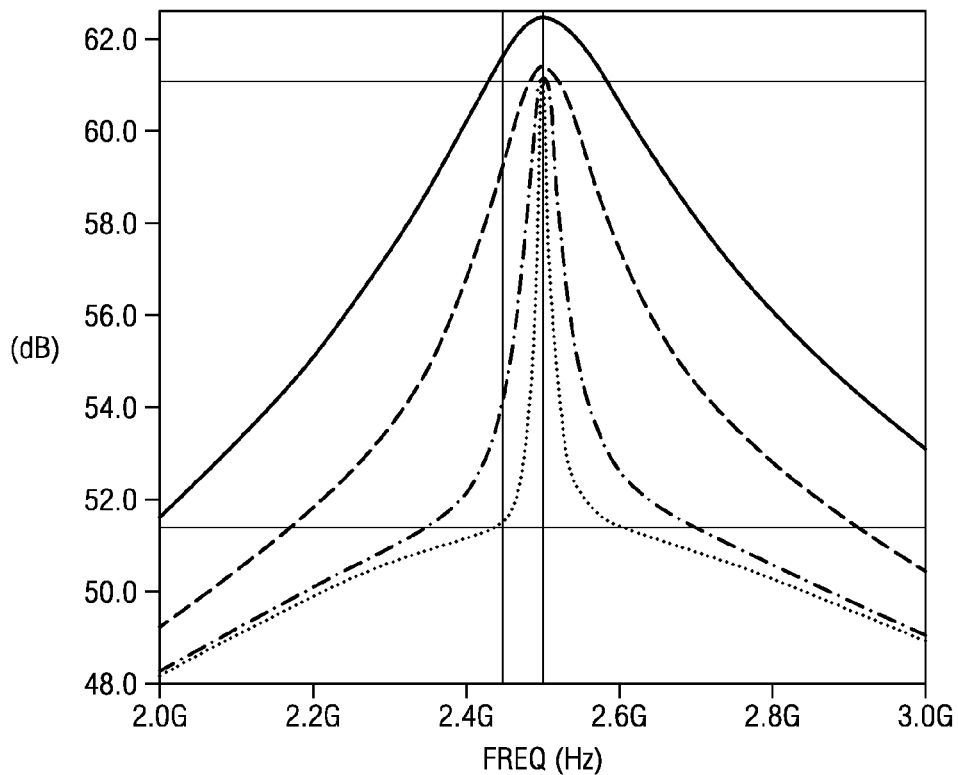
FIG. 3 is a graph of simulated impedance offered by the inventive circuit of FIG. 2 versus frequency, and showing a family of impedance curves with capacitance $C_T$ as the parameter and holding local oscillator LO frequency constant.

In FIG. 3, simulation results are shown wherein the Y-axis represents impedance (48 db to 64 db range) V_out/I_in offered by the network of FIG. 2, and X-axis represents Frequency (2.0-3.0 GHz range). A family of different curves in FIG. 3 are established in response to different values of FIG. 2 capacitance $C_T$. Note that the width of the pass band, or the effective quality factor Q of the circuit, is readily adjustable in response to changes in the capacitance $C_T$ with a given constant LO frequency.

Figure 4:
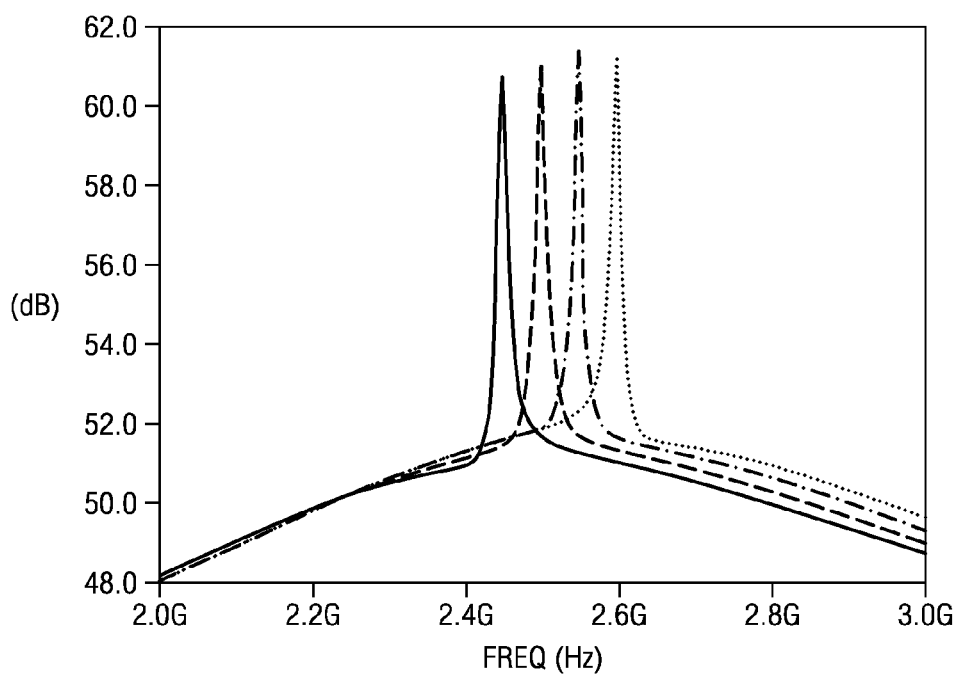
FIG. 4 is a graph of simulated impedance offered by the inventive circuit of FIG. 2 versus frequency, and showing a family of impedance curves with LO frequency as the parameter and holding capacitance $C_T$ constant.

In FIG. 4, simulation results are shown wherein the Y-axis represents impedance (48 db to 62 db range) V_out/I_in offered by the network of FIG. 2, and X-axis represents Frequency (2.0-3.0 GHz range). A family of different curves are provided for different values of Frequency of the LO (local oscillator), which is made adjustable in frequency in some embodiments. This family of curves desirably shows that the pass band of the LC network can be readily tuned in center frequency, i.e. has a readily tunable center frequency in response to changes in the LO frequency with a given constant capacitance $C_T$.

Figure 5:
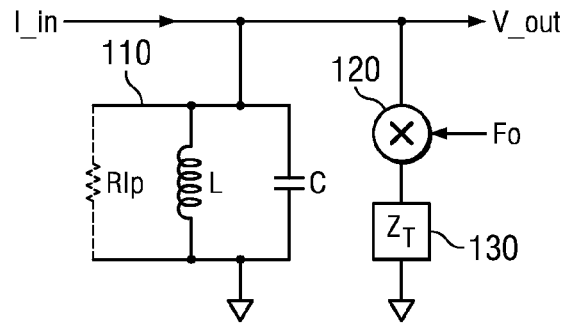
FIG. 5 is another partially schematic, partially block diagram of an inventive RF filter circuit.

In FIG. 5, note that more or less inherent resistance $RI_p$ makes for less or more quality factor Q in the on-chip LC 110. To get a 3 dB filtering at a nearby or close-in frequency (e.g., 5 MHz away from RF signal frequency of 2.4 GHz), and starting from a Q on the order of 10 for on-chip LC 110, the bi-directional mixer 120 (200) and translated impedance $Z_T$ (e.g., $C_T$) easily achieve this practically, economically and reliably. Other specific numerical examples of the benefits of the embodiments should now be apparent to the reader.

Figure 6:
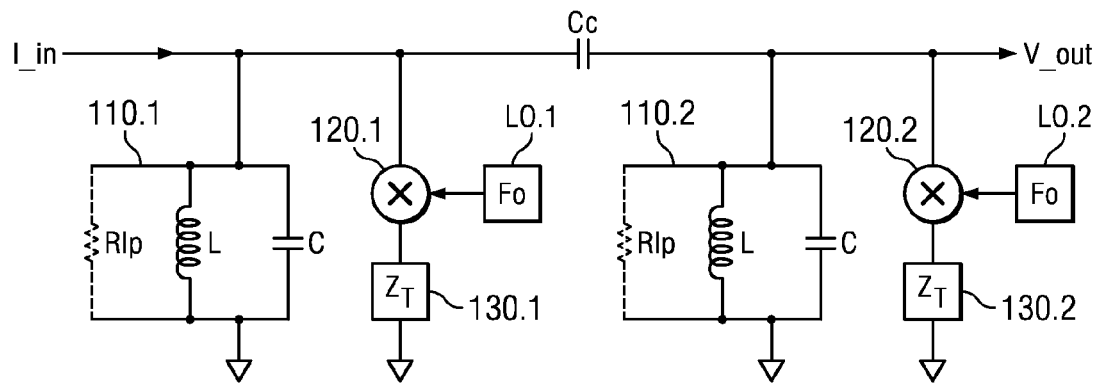
FIG. 6 is a partially schematic, partially block diagram of an inventive cascaded RF filtering circuit.

In FIG. 6, another embodiment provides a cascaded extension of the embodiment of FIG. 5 to filters with multiple coupled LC tanks as shown in FIG. 6. LC circuit 110.1 is coupled by a coupling capacitor $C_C$ to another LC circuit 110.2. Across and associated with LC circuit 110.1 is a mixer 120.1 with low reverse isolation in series with an impedance $Z_T$ to circuit common. The mixer 120.1 is fed by a local oscillator LO.1 with frequency Fo. Similarly, across and associated with LC circuit 110.2 is a mixer 120.2 with low reverse isolation in series with an impedance $Z_T$ to circuit common. Mixer 120.2 is fed by local oscillator LO.2 with frequency Fo. Further such circuits 120.$i$, 130.$i$, are added in cascade, to an extent suited to particular embodiments. One local oscillator LO.1 suitably feeds frequency Fo to both mixers 120.1 and 120.2 instead of using two different local oscillators. Other arrangements of plural impedance translation circuits are contemplated, provided and employed to obtain particular bandpass characteristics, insertion gain or loss, etc.

Various embodiments are suitably applied in either or both of a transmitter and/or receiver TX/RX that can benefit from them, see FIGS. 8-10 discussed later hereinbelow. In Bluetooth or Zigbee the signal bandwidth is low (<1 MHz), and a small loss may occur due to insertion of an embodiment using bi-directional mixer 120 (200) and impedance $Z_T$ or translation capacitance $C_T$ such as in FIGS. 1, 2 and 5. The insertion loss is quite-acceptably low (near 1 dB) and the economical circuitry can readily be used.

A tradeoff may nevertheless exist between the loss due to insertion of the additional circuitry, e.g. mixer 120 and capacitance $C_T$, versus obtaining a moderate but filtered bandwidth that will sufficiently reject close-in interferers. If the low pass characteristic of a capacitance $C_T$ that can reject close-in interferers may start to roll off inside the moderate bandwidth of a desired signal, then that loss due to insertion becomes a tradeoff with the moderate bandwidth called for. Considering this tradeoff in WLAN, the WLAN signal bandwidth is higher (20 MHz) than in Bluetooth or Zigbee, and the desired-signal loss due to insertion of this circuit 120 with capacitance $C_T$ could be several dB.

Figure 7:
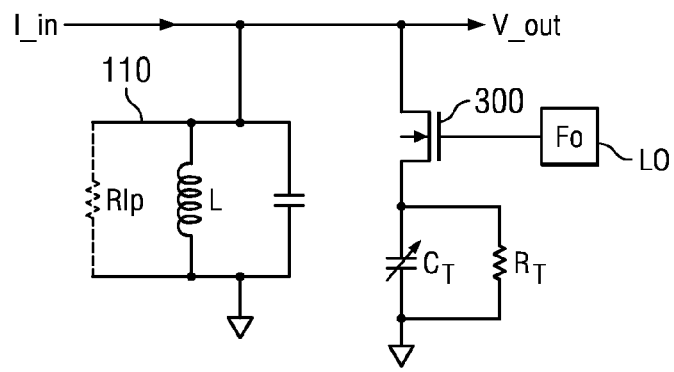
FIG. 7 is a schematic diagram of a more specific example of an inventive circuit for RF filtering of FIG. 5.

In FIG. 7, to overcome the tradeoff, a shunt resistance $R_T$ is provided in parallel with the capacitance $C_T$. This resistance-capacitance RC combination delivers a translation impedance $Z_T$ with 3 db bandwidth value of $1/(2\pi R_T C_T) > 20$ MHz that is used in place of or instead of a single capacitor $C_T$ such as in a WLAN application. Use of an RC translation impedance for $Z_T$ instead of capacitance-only $C_T$ ensures that no filtering or frequency shaping of consequence occurs below 20 MHz and blocking filter performance will be formed above 20 MHz, i.e., beyond the RC pole frequency to block interferers.

Various embodiments are thus applicable to Bluetooth, Zigbee, WLAN, UWB, WiMax and many other systems.

Some multi-use or multi-band embodiments provide a switchable resistance $R_T$ and switching circuit to insert or remove it in FIG. 7. More complex networks are suitably provided to shape the filter response curve. Such complex networks may include plural capacitances and/or resistances and may include one or more inductances and one or more further active elements. Switching or adjustment for any one or more parameters of a component or circuit for implementing the desired impedance $Z_T$ or filter block is contemplated by providing any suitable circuit or component to perform such switching or adjustment. Also, the parallel LC network is not meant by way of limitation since other inductance-capacitance networks, for instance, can be provided such as L-network, T-network, pi-network, etc. The coupling of the bidirectional mixer to the RF filter network can be ohmic as shown or coupled by mutual inductance or a coupling capacitance. The RF filter network shown as a parallel LC network has at least some part or portion coupled to one or more mixers.

In FIG. 7, one implementation example uses a single NMOS switch 300 as a bi-directional mixer with low reverse isolation. The gate of NMOS switch 300 is driven by LO frequency Fo, and its source and drain are coupled between the LC filter 110 and the adjustable capacitance $C_T$ and shunt resistance $R_T$ to establish a desired impedance curve versus frequency. Current input I_in delivers an output voltage V_out according to a transfer function established by the circuitry.

In FIG. 8, a receiver chain has low noise amplifier LNA 410 coupled by a coupling capacitor Cc to couple an RF communication signal to the input of a Mixer 420 to down convert RF to an intermediate frequency IF. Mixer 420 supplies the IF to an IF amplifier 430 that supplies output voltage V_out. This receiver embodiment inserts the LC filter 110 with mixer 120-translated impedance $Z_T$ 130 after LNA 410 in the receive path. The bi-directional mixer 120 has low reverse isolation and shunts close-in interfering energy as shown by the down-arrow into the impedance $Z_T$ and away from the input of mixer 420. Mixer 420 has a local oscillator that can have the same LO frequency as that of the bi-directional mixer for reduced LO circuitry. In some embodiments having both a mixer 420 and the bi-directional mixer 120, the LO frequency Fo of the bi-directional mixer 120 is different from that of the mixer 420. The LO frequency of the bi-directional mixer 120 and the circuit with impedance $Z_T$ are chosen so that the appropriate filter passband or stop band, or filter transfer function generally, is presented to the receive signal path in which the LC circuit lies between RF IN and V_out. Using different LO frequencies for the IF mixer and the bi-directional mixer can be useful for reducing, minimizing or optimizing unwanted LO injection back through the bi-directional mixer 120 into the receive path and IF path.

In FIG. 8, a coupling capacitor $C_C$ has a first end coupled to a particular above-described bi-directional mixer with low reverse isolation 120, and the coupling capacitor $C_C$ has a second end coupled to the input of mixer 420. Mixer 420 is followed by IF amplifier (IFA) 430. By contrast with using or using only a post-IFA low-pass filter LPF at low frequency or baseband, the additional bi-directional mixer/impedance filter circuit 110, 120, 130 blocks and prevents high-power close-in interferers from reaching the mixer 420. Such positioning of circuit 110, 120, 130 also prevents such interferers from overloading the input of the IF amplifier IFA 430, which is likely to have high IF amplifier linearity specifications. Instead, the bi-directional mixer 120 conveniently shunts the high-power close-in interferers into impedance $Z_T$ where they are harmless.

Also in FIG. 8, on receive, feed-through of LO energy through the bi-directional mixer 120 into the input of mixer 420 should be made desirably small so as not to interfere with the signal reception. The magnitude of unwanted LO injection into the receive path to mixer 420 is kept low by using an integrated circuit layout of bi-directional mixer 120 physically sized smaller than that of the mixer 420 used in the desired signal path. The bi-directional mixer 120 effectively is made to present a smaller feed-through capacitance $C_f$ having a higher impedance in series with the larger input capacitance $C_i$ of larger-sized mixer 420 having lower input impedance. This sizing arrangement or capacitance relationship divides down the fed-through LO voltage substantially so that little unwanted LO injection from bi-directional mixer 120 is present in the receive path to mixer 420. Thus, in FIGS. 8 and 10, the implementer determines a satisfactory ratio of the translation mixer 120 dimensions to the mixer 420 dimensions. If the exact ratio is initially unknown, an iterative, simulation based approach is suitably used to optimize operation of the design as contemplated here.

In FIG. 9, a transmitter embodiment inserts the LC filter 110 with LO-driven mixer 120 and translated capacitance or impedance $Z_T$ 130 ahead of a power amplifier PA 510 in the transmit path. The bi-directional Mixer 120 here also has low reverse isolation. An up-converting mixer 520 up-converts a communication signal from an IF amplifier 530. Up-converting mixer 520 is fed by the same local oscillator LO or a separate LO having the same frequency Fo or a different frequency as desired. Another coupling capacitor $C_C$ is coupled between PA 510 input and LC 110 as well as to the mixer 520 output and to the receive path end of bi-directional Mixer 120. Amplifier 530 is supplied with either a baseband signal or an IF signal V_in and feeds amplified signal to an input of mixer 520.

Separate circuits as shown in FIGS. 8 and 9 can be provided and used separately in a transmitter-receiver TX/RX transceiver combination. Then in the FIG. 9 transmitter, one or both of bi-directional mixer 120 and impedance $Z_T$ 130 can have different particular mixer 120 and impedance $Z_T$ parameters compared to analogous but not-necessarily-identical parameters for mixer 120 and impedance $Z_T$ in the receiver of FIG. 8. Alternatively, circuitry embodiments as shown in one of FIG. 8 or FIG. 9 can be used in a transceiver, such as by having the receiver include the bi-directional mixer 120 circuitry and by omitting that mixer 120 circuitry in the transmitter (or vice-versa).

In FIG. 10, another transceiver embodiment 600 such as a Bluetooth TX/RX inserts a shared LC 110 with a shared mixer 120 and impedance $Z_T$ 130 before PA 510 in TX path and after LNA 410 in an RX path. The single bi-directional Mixer 120 circuitry has low reverse isolation. Use of one instance of LC 110, mixer 120 and impedance 130 thus involves half as many such parts in the transmitter and receiver as are in a transceiver embodiment using a separate RX path of FIG. 8 separate from a TX path of FIG. 9. The FIG. 10 placement of the LC 110, bi-directional mixer 120 and impedance $Z_T$ 130 conveniently shares them all along a line 610 supporting intermediate signal level. Line 610 is connected to the following: to LNA 410 output, to Mixer 520 output, to capacitor Cc and capacitively to Mixer 420 input, to capacitor Cc2 and capacitively to PA 510 input, to LC 110, and to bi-directional mixer 120. Mixer 120 and impedance $Z_T$ need not be isolated nor effectively disconnected such as by transmit/receive switching in FIG. 10 unless some additional reason exists to do so. Local oscillator LO is coupled to each of bi-directional mixer 120, down-converting receive mixer 420 and up-converting transmit mixer 520.

Transmit/receive switching (not shown) in power paths may be introduced if desired to energize the LNA or PA alternately, such as is shown in U.S. Patent Application Publication 20090289721, Rajendran et al., Nov. 26, 2009 (TI-66109) filed May 5, 2009, which is incorporated herein by reference in its entirety. See also U.S. Patent Application Publication 20100027568 Rajendran et al., Feb. 4, 2010 (TI-65587) filed Jul. 29, 2008, which is incorporated by reference herein in its entirety. Circuits for the LNA and/or PA are taken from said incorporated patent application publications TI-66109 and TI-65587 and used in any or all of FIGS. 8, 9 and 10. Single-ended and balanced forms of the embodiments of FIGS. 1, 2 and 5-7 are applied singly or in cascade or otherwise in a multiple way in the context of FIGS. 8-10 and said incorporated patent application publications TI-66109 and TI-65587 and otherwise.

Some embodiments concurrently operate the TX and RX full duplex and use various components such as duplexers or circulators in strip-line layout or otherwise. Thus a variety of embodiments accommodate systems operating at various frequencies of both the receiver and transmitter and/or different frequencies for each of them.

In FIG. 11, an improved communications system 2000 has system blocks as described next and improved with any one, some or all of the circuits and subsystems shown in various other Figures of the drawing. Any or all of the system blocks, such as cellular mobile telephone and data handsets 2010 and 2010', a cellular (telephony and data) base station 2050, a WLAN AP (wireless local area network access point, IEEE 802.11 or otherwise) 2060, a Voice over WLAN Gateway 2080 with user voice over packet telephone 2085 (not shown), and a voice enabled personal computer (PC) 2070 with another user voice over packet telephone (not shown), communicate with each other in communications system 2000.

Camera 1490 provides video pickup for cell phone 2010 to send over the internet to cell phone 2010', personal digital assistant/personal entertainment unit PDA/PEU 2096, TV 2094, automobile 2095 and to a monitor of personal computer PC 2070 via any one, some or all of cellular base station 2050, DVB station 2020, WLAN AP 2060, set top box STB 2092, and WLAN gateway 2080. Handset 2010 has a video storage and other storage, such as hard drive, flash drive, high density memory, and/or compact disk (CD) in the handset for digital video recording (DVR) such as for delayed reproduction, transcoding, and retransmission of video to other handsets and other destinations.

On a cell phone printed circuit board (PCB) 1020 in handset 2010, is provided a higher-security processor integrated circuit 1022, an external flash memory 1025 and SDRAM 1024, and a serial interface 1026. A Power, Resets and Control Module PRCM 1050 (1185, 1470 of FIG. 12) is provided for smart power management. Serial interface 1026 is suitably a wireline interface, such as a USB interface connected by a USB line to the personal computer 2070 and magnetic and/or optical media 2075. Cell phone 2010 intercommunication also occurs via a cellular modem, WLAN, Bluetooth and/or otherwise and from a website 2055 or 2065, television and physical layer (PHY) or other circuitry 1028. Processor integrated circuit 1022 has MPU (or CPU) block 1030 coupled to an internal (on-chip read-only memory) ROM 1032, an internal RAM 1034, and flash memory 1036. A security logic circuit 1038 is coupled to secure-or-generalpurpose-identification value (Security/GPI) bits 1037 of a non-volatile one-time alterable Production ID register or array of electronic fuses (E-Fuses). Depending on the Security/GPI bits, boot code residing in ROM 1032 responds differently to a Power-On Reset (POR) circuit 1042 and to a secure watchdog circuit 1044 coupled to processor 1030.

In FIG. 12, handset 2010 has an integrated circuit 1100 that includes a digital baseband (DBB) block that has a RISC processor 1105 and a digital signal processor 1110, communications and security software, and security accelerators 1140. A memory controller interfaces the RISC core 1105 and the DSP core 1110 to Flash memory 1025 and SDRAM 1024. On chip RAM 1120 and on-chip ROM 1130 also are accessible to the processors 1105 and 1110 for providing sequences of software instructions and data thereto. A security logic circuit 1038 of FIGS. 11 and 12 has a secure state machine (SSM) to provide hardware monitoring of any tampering with security features. A Secure Demand Paging (SDP) circuit 1040 is provided for effectively-extended secure memory.

Digital circuitry 1150 on integrated circuit (IC) 1100 supports and provides wireless interfaces for any one or more of GSM, GPRS, EDGE, UMTS, and OFDMA/MIMO embodiments. Digital circuitry 1160 provides codec for CDMA (Code Division Multiple Access), CDMA2000, and/or WCDMA (wideband CDMA or UMTS) wireless suitably with HSDPA/HSUPA (High Speed Downlink Packet Access, High Speed Uplink Packet Access) (or 1xEV-DV, 1xEV-DO or 3xEV-DV) data feature via the analog baseband chip 1200 and RF GSM/CDMA chip 1300. Audio/voice block 1170 supports audio and speech/voice functions and interfacing. Speech/voice codec(s) and user voice-recognition/voice control are suitably provided in memory space in audio/voice block 1170 for processing by processor(s) 1110. Applications interface 1180 couples the digital baseband 1100 to applications processor 1400. Power resets and control module (PRCM) 1185 provides power management circuitry for integrated circuit (IC) chip 1100. IC chip 1100 is coupled to location-determining circuitry 1190 for GPS (Global Positioning System). IC 1100 is also coupled to a USIM (UMTS Subscriber Identity Module) 1195.

In FIG. 12, a mixed-signal integrated circuit 1200 includes an analog baseband (ABB) block 1210 for GSM/GPRS/EDGE/UMTS/HSDPA/HSUPA and an analogous ABB for CDMA wireless and any associated 1xEV-DV, 1xEV-DO or 3xEV-DV data and/or voice with its respective SPI (Serial Port Interface), digital-to-analog conversion DAC/ADC block, and RF Control pertaining to CDMA and coupled to RF (CDMA) chip 1300. An audio block 1220 has audio I/O (input/output) circuits to a speaker 1222, a microphone 1224, and headphones (not shown). A control interface 1230 has a primary host interface (I/F) and a secondary host interface to DBB-related integrated circuit 1100 for the respective GSM and CDMA paths.

A power conversion block 1240 includes buck voltage conversion circuitry for DC-to-DC conversion, and low-dropout (LDO) voltage regulators for power management/sleep mode of respective parts of the chip supplied with voltages VDDx regulated by the LDOs. Power conversion block 1240 provides information to and is responsive to a power control state machine between the power conversion block 1240 and circuits 1250 for clocking chip 1200. A touch screen interface 1260 is coupled to a touch screen XY 1266 off-chip for display and control. Battery 1280 provides power to the system and battery data to circuit 1250 on suitably provided lines from the battery pack.

In FIG. 12 an RF integrated circuit 1300 includes a GSM/GPRS/EDGE/UMTS/ CDMA/MIMO-OFDMA RF transmitter block 1310 fed by baseband block 1210 of chip 1200, and Transmitter 1310 drives a dual band RF cellular telecommunications RF front-end module 1380 coupled to one or more antennas 1015. Antenna 1015 is coupled to PA(s) and LNA(s) (low noise amplifiers) as described elsewhere herein and depicted in FIGS. 8-10. The cellular telephone handset 2010 thus has any of user interface transducers 1222, 1224, 1266, other displays and other user interface transducers ultimately coupled to that plurality of electronic circuits of FIGS. 8-10. LNA(s) couples to GSM/GPRS/EDGE/UMTS/CDMA demodulator 1370 to produce I/Q (in-phase, quadrature outputs) to baseband block 1210. Replication of blocks and antennas is provided in a cost-efficient manner to support MIMO OFDMA embodiments.

Chip 1400 has an applications processing section 1420 RISC processor 1422 (such as MIPS® core(s), ARM® core(s), or other suitable processor), a digital signal processor 1424, and a shared memory controller MEM CTRL 1426 with DMA (direct memory access), and a 2D/3D graphic accelerator. Speech/voice codec functionality is processed. Off-chip memory resources 1435 include DRAM and flash memory. Shared memory controller 1426 interfaces the RISC processor 1422 and the DSP 1424 via an on-chip bus to on-chip memory 1440 with RAM and ROM. Security logic 1038 of FIGS. 11 and 12 (1038, 1450) includes hardware-based protection circuitry, also called security monitoring logic or a secure state machine SSM to monitor busses and other parts for security violations. A JTAG emulation interface couples to an off-chip emulator Debugger, I2C interfaces to analog baseband ABB chip 1200, and an interface couples to applications interface 1180.

DLP™ display technology from Texas Instruments Incorporated is coupled to interface 1410 or otherwise as convenient. A transparent organic semiconductor display is provided on one or more windows of the vehicle 2095 of FIG. 1 and wirelessly or wireline-coupled to the video feed.

In FIG. 12, a WLAN and/or WiMax integrated circuit 1500 includes MAC (media access controller) 1510, PHY (physical layer) 1520 and AFE (analog front end) 1530. AFE 1530 is bidirectionally coupled for transmit and receive to fully-integrated WLAN RF front-end module as shown in any one, some or all of FIGS. 8-10 herein. A MIMO UWB (ultra wideband) MAC/PHY supports OFDM in 3-10 GHz. UWB bands. communications in some embodiments. A digital video integrated circuit 1610 provides television antenna 1615 tuning, antenna selection, filtering, and RF input stage for recovering video/audio/controls from DVB station.

The voltage states on input control lines are suitably coupled from and established by corresponding bits in a control register written, read and operated by any controlling processor in FIG. 12. Such controlling processor is suitably situated in WLAN/BT unit 1500, or is provided such as the RISC processor 1422 or DSP 1424 in application processing chip 1400, or the RISC processor 1105 or DSP 1110 in digital baseband 1100. Still other system devices such as those depicted or described in connection with FIG. 11 are provided with the circuitry and controls of the other Figures herein.

Various embodiments are used with one or more microprocessors, each microprocessor having a pipeline is selected from the group consisting of 1) reduced instruction set computing (RISC), 2) digital signal processing (DSP), 3) complex instruction set computing (CISC), 4) superscalar, 5) skewed pipelines, 6) in-order, 7) out-of-order, 8) very long instruction word (VLIW), 9) single instruction multiple data (SIMD), 10) multiple instruction multiple data (MIMD), 11) multiple-core using any one or more of the foregoing, and 12) microcontroller pipelines, control peripherals, and other microcontrol blocks using any one or more of the foregoing.

Various embodiments of process and structure are provided in one or more integrated circuit chips, multichip modules (MCMs), device to device (D2D) technology, printed wiring media and printed circuit boards, handsets and larger application boxes, vehicles and platforms.

Aspects (See Explanatory Notes at End of this Section)

A few preferred embodiments have been described in detail hereinabove. It is to be understood that the scope of the invention comprehends embodiments different from those described, as well as described embodiments, yet within the inventive scope. Microprocessor and microcomputer are synonymous herein. Processing circuitry comprehends digital, analog and mixed signal (digital/analog) integrated circuits, ASIC circuits, PALs, PLAs, decoders, memories, non-software based processors, microcontrollers and other circuitry, and digital computers including microprocessors and microcomputers of any architecture, or combinations thereof. Internal and external couplings and connections can be ohmic, capacitive, inductive, photonic, and direct or indirect via intervening circuits or otherwise as desirable. Implementation is contemplated in discrete components or fully integrated circuits in any materials family and combinations thereof. Various embodiments of the invention employ hardware, software or firmware. Process diagrams and block diagrams herein are representative of flows and/or structures for operations of any embodiments whether of hardware, software, or firmware, and processes of manufacture thereof.

While this invention has been described with reference to illustrative embodiments, this description is not to be construed in a limiting sense. Various modifications and combinations of the illustrative embodiments, as well as other embodiments of the invention may be made. The terms "including", "includes", "having", "has", "with", or variants thereof are used in the detailed description and/or the claims to denote non-exhaustive inclusion in a manner similar to the term "comprising". It is therefore contemplated that the appended claims and their equivalents cover any such embodiments, modifications, and embodiments as fall within the true scope of the invention.

What is claimed is:

1. An active filter circuit comprising:
   an inductance-capacitance (LC) circuit for wireless frequency input;
   a bi-directional mixer and a filter impedance coupled across at least part of said LC circuit; and
   another mixer coupled to at least some portion of said LC circuit; and
   further comprising a second LC circuit and a second bi-directional mixer and second filter impedance series-coupled across at least part of said second LC circuit; and
   the foregoing cascaded with respect to said first LC circuit.

2. The circuit claimed in claim 1 wherein said filter impedance includes a capacitance.

3. The circuit claimed in claim 2 wherein said filter impedance further includes a resistance.

4. The circuit claimed in claim 1 wherein said bidirectional mixer includes an element selected from the group consisting of A) field effect transistor, B) varactor, C) micro-electro-mechanical switch, D) diode, E) bridge.

5. The circuit claimed in claim 1 wherein said bidirectional mixer includes a plurality of elements that collectively have a balanced topology.

6. An active filter circuit comprising:
   an inductance-capacitance (LC) circuit for wireless frequency input;
   a bi-directional mixer and a filter impedance coupled across at least part of said LC circuit; and
   another mixer coupled to at least some portion of said LC circuit
   wherein said bidirectional mixer includes a first pair and a second pair of field effect transistors and said first pair have sources respectively coupled across said at least part of said LC circuit, and said first pair have drains coupled to opposite ends of said filter impedance.

7. The circuit claimed in claim 6 wherein said second pair also have sources respectively coupled across said at least part of said LC circuit and said second pair have drains coupled in opposite sense across the ends of said filter impedance compared to the drains of said first pair.

8. The circuit claimed in claim 1 wherein said LC circuit includes a parallel inductor and capacitance.

9. The circuit claimed in claim 1 further comprising a local oscillator coupled to said bidirectional mixer.

10. The circuit claimed in claim 9 wherein said local oscillator is adjustable in frequency.

11. The circuit claimed in claim 9 wherein said filter impedance is adjustable.

12. A wireless receiver front end comprising:
    a low noise amplifier (LNA) having an output;
    an RF filter circuit fed from the output of said LNA;
    a bi-directional mixer and a filter impedance coupled to at least part of said RF filter circuit; and
    a second mixer coupled to at least some portion of said RF filter circuit.

13. The wireless receiver front end claimed in claim 12 further comprising a local oscillator coupled to both said bidirectional mixer and said second mixer.

14. The wireless receiver front end claimed in claim 12 wherein said bidirectional mixer includes an element selected from the group consisting of A) field effect transistor, B) varactor, C) micro-electro-mechanical switch, D) diode, E) bridge.

15. The wireless receiver front end claimed in claim 12 wherein said bidirectional mixer includes a plurality of elements coupled to said filter impedance that collectively present a balanced topology to said RF filter circuit.

16. The wireless receiver front end claimed in claim 12 further comprising a local oscillator (LO) coupled to said bidirectional mixer wherein said bidirectional mixer has a feed-through impedance and said second mixer has an input impedance larger than that feedthrough impedance, whereby reducing feed-through of LO energy through the bi-directional mixer into the second mixer.

17. The wireless receiver front end claimed in claim 12 further comprising an integrated circuit and said bidirectional mixer and said second mixer each are laid out on the integrated circuit and bi-directional mixer is physically sized smaller than said second mixer.

18. A wireless transmitter comprising:
    an RF power amplifier (PA) having an input;
    an RF filter circuit coupled to the input of said PA;
    a bi-directional mixer and a baseband filter impedance coupled to at least part of said RF filter circuit; and
    an up-converting mixer coupled to feed at least some portion of said RF filter circuit.

19. The wireless transmitter claimed in claim 18 further comprising a local oscillator coupled to both said bi-directional mixer and said up-converting mixer.

20. The wireless transmitter claimed in claim 18 wherein said bi-directional mixer includes an element selected from the group consisting of A) field effect transistor, B) varactor, C) micro-electro-mechanical switch, D) diode, E) bridge.

21. The wireless transmitter claimed in claim 18 wherein said bidirectional mixer includes a plurality of elements coupled to said baseband filter impedance that collectively present a balanced topology to said PA input.

22. The wireless transmitter claimed in claim 18 further comprising a low noise amplifier (LNA) having an output coupled to at least portion of said RF filter circuit; and a down-converting mixer having an input coupled to at least some part of said RF filter circuit, whereby a transceiver is provided.

23. The wireless transmitter claimed in claim 22 further comprising a local oscillator coupled to said bi-directional mixer, to said down-converting mixer and to said up-converting mixer.

24. A process for operating an electronic circuit, the process comprising: RF filtering and impedance-translating a baseband filter impedance into the RF filtering by bi-directional mixing while further coupling the RF filtering with separate mixing for a communication-related signal.

25. The process of claim 24, wherein said bi-directionally mixing includes operating a first pair and a second pair of field effect transistors and, said first pair have sources respectively coupled across said at least part of an LC circuit, and said first pair have drains coupled to opposite ends of circuitry for said impedance-translating.

* * * * *